(12) United States Patent
Chen et al.

(10) Patent No.: US 12,369,335 B2
(45) Date of Patent: Jul. 22, 2025

(54) MIS CAPACITOR AND METHOD OF MAKING A MIS CAPACITOR

(71) Applicant: NXP B.V., Eindhoven (NL)

(72) Inventors: Chao Chen, Shanghai (CN); Zhouyi Luo, Shanghai (CN); Feng Cong, Shanghai (CN)

(73) Assignee: NXP B.V., Eindhoven (NL)

( * ) Notice: Subject to any disclaimer, the term of this patent is extended or adjusted under 35 U.S.C. 154(b) by 620 days.

(21) Appl. No.: 17/807,869

(22) Filed: Jun. 21, 2022

(65) Prior Publication Data
US 2023/0006072 A1 Jan. 5, 2023

(30) Foreign Application Priority Data

Jun. 30, 2021 (CN) .......................... 202110740686.8

(51) Int. Cl.
H10D 1/66 (2025.01)
H03F 3/45 (2006.01)
H10D 1/00 (2025.01)

(52) U.S. Cl.
CPC ........... H10D 1/66 (2025.01); H03F 3/45475 (2013.01); H10D 1/047 (2025.01)

(58) Field of Classification Search
CPC ......... H10D 1/66; H10D 1/047; H10D 84/204
See application file for complete search history.

(56) References Cited

U.S. PATENT DOCUMENTS

| 6,744,303 | B1 | 6/2004 | Maley |
| 7,446,549 | B2 | 11/2008 | Tomita et al. |
| 7,994,827 | B2 | 8/2011 | Williams |
| 9,722,593 | B2 | 8/2017 | Berkhout et al. |
| 9,960,755 | B2 | 5/2018 | Mengad |
| 10,594,210 | B1 | 3/2020 | Mercer et al. |
| 10,826,482 | B1 | 11/2020 | Kwok et al. |
| 2005/0035410 | A1 | 2/2005 | Yeo et al. |
| 2008/0237673 | A1 | 10/2008 | Wada et al. |

(Continued)

FOREIGN PATENT DOCUMENTS

CN 201515362 U 6/2010

OTHER PUBLICATIONS

U.S. Appl. No. 17/443,972 Notice of Allowance, filed Apr. 5, 2023 (9 pages).

(Continued)

Primary Examiner — Wasiul Haider

(57) ABSTRACT

A MIS capacitor and a method of making the same. The capacitor includes a semiconductor substrate having a first part having a first conductivity type and contact regions for coupling the first part to an output node. The substrate has dielectric on a surface of the first part and electrodes on the dielectric. The substrate has a second part having a second conductivity type and a third part having the first conductivity type. The third part is coupleable to a supply voltage. The second part is located between the first part and the third part. The first part and the second part form a first p-n junction and the second part and the third part form a second p-n junction. A reference contact is provided for coupling the second part to a reference voltage. A further contact region is provided for coupling the second part to the output node.

20 Claims, 4 Drawing Sheets

(56) References Cited

U.S. PATENT DOCUMENTS

| | | | |
|---|---|---|---|
| 2010/0226166 A1* | 9/2010 | Jung | G11C 5/145 |
| | | | 257/E29.345 |
| 2014/0300413 A1 | 10/2014 | Hoyerby et al. | |
| 2021/0174740 A1* | 6/2021 | Qian | G09G 3/3233 |
| 2021/0257907 A1 | 8/2021 | Lai et al. | |
| 2022/0131456 A1 | 4/2022 | Lai et al. | |

OTHER PUBLICATIONS

NXP; "PCA9481AUK 10 A 2:1/1:2/1:1 mode switched capacitor direct charger" Rev. 1.0; Aug. 23, 2022 Product short data sheet; 6 pages.
NXP; "PCA9482UK 7 A 2:1, 1:2, and 1:1 mode switched capacitor direct charger" Rev. 1.0; Nov. 8, 2022 Short data sheet; 6 pages.
U.S. Appl. No. 17/443,972, filed Jul. 29, 2021 (23 pages).

* cited by examiner

MIS CAPACITOR AND METHOD OF MAKING A MIS CAPACITOR

CROSS-REFERENCE TO RELATED APPLICATIONS

This application claims the priority under 35 U.S.C. § 119 of China patent application no. 202110740686.8, filed Jun. 30, 2021 the contents of which are incorporated by reference herein.

BACKGROUND

The present specification relates to a Metal Insulator Semiconductor (MIS) capacitor and a method of making a Metal Insulator Semiconductor (MIS) capacitor.

Integrated MIS capacitors, such as Metal Oxide Semiconductor (MOS) capacitors, can be used in analog circuits to construct filters or apply frequency compensation. In most cases, the leakage current of these MIS capacitors is relatively small and does not influence circuit performance. However, in certain applications, the leakage current through a MIS capacitor can be significant and unacceptable. Examples of such applications include: Low quiescent current design, ultra-low power applications like amplifiers, buffers, active filters and oscillators; Low system offset designs or high precision circuits; Circuits that require a large area of capacitor devices; and Circuits that require leakage currents which do not increase dramatically with increasing temperature.

In high accuracy amplifiers with low input offset, small extra currents introduced by capacitor leakage can lead to large equivalent systematic offsets which can make the output of amplifier inaccurate and unreliable.

With lower quiescent currents, the leakage may become even more significant. For example, a high gain output stage in an amplifier may use a small current mirror loading of around 1 µA or even less for the purpose of higher output impedance. If this output node is connected to a large compensation/loading MIS capacitor, the capacitor PN junction diode reverse leakage current may increase the equivalent input offset by roughly $I_{leak}$/Gm_amp, where $I_{leak}$ is the leakage current of the MIS capacitor and Gm_amp is the equivalent transconductance of the amplifier. For example, a leakage current of 10 nA at the output node can create a 100 µV input offset if Gm_amp=100 µS, which may be an unacceptable result for low offset implementations like instrumentation amplifiers or other high precision amplifiers.

The leakage current is may be generated by a PN junction of MIS capacitor. The leakage current may increase exponentially with increasing temperature.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a Metal Insulator Semiconductor, "MIS", capacitor comprising: a semiconductor substrate comprising: a first part having a first conductivity type; a plurality of contact regions located in the first part for coupling the first part to an output node; dielectric located on a surface of the first part; a plurality of electrodes separated from the first part by the dielectric; a second part having a second conductivity type; and a third part having the first conductivity type, wherein the third part is coupleable to a supply voltage, wherein the second part is located between the first part and the third part, wherein the first part and the second part form a first p-n junction and wherein the second part and the third part form a second p-n junction; a reference contact for coupling the second part to a reference voltage; and a further contact region for coupling the second part to the output node.

According to another aspect of the present disclosure, there is provided a method of making a Metal Insulator Semiconductor, "MIS", capacitor, the method comprising: forming a semiconductor substrate comprising: a first part having a first conductivity type; a second part having a second conductivity type; and a third part having the first conductivity type, wherein the third part is coupleable to a supply voltage, wherein the second part is located between the first part and the third part, wherein the first part and the second part form a first p-n junction and wherein the second part and the third part form a second p-n junction; forming a plurality of contact regions in the first part for coupling the first part to an output node; forming dielectric on a surface of the first part; forming a plurality of electrodes on the dielectric, wherein the plurality of electrodes are separated from the first part by the dielectric; forming a reference contact for coupling the second part to a reference voltage; and forming a further contact region for coupling the second part to the output node.

An orientation of the first p-n junction within the substrate may be opposite to an orientation of the second p-n junction within the substrate.

A reverse bias leakage current of the first p-n junction may at least partially cancel a reverse bias leakage current of the second p-n junction.

The reverse bias leakage current of the first p-n junction may be substantially equal to the reverse bias leakage current of the second p-n junction.

The MIS capacitor may further include a first well region having the second conductivity type. The first well region may be located between the reference contact and the second part.

The MIS capacitor may further include a second well region having the second conductivity type. The second well region may be located between the further contact region and the second part.

The first part, the second part and the third part may each comprise a well or layer of semiconductor material located in the semiconductor substrate.

The first conductivity type may be n-type conductivity and the second conductivity type may be p-type conductivity.

The reference voltage may be ground.

According to a further aspect of the present disclosure, there is provided an amplifier circuit including a MIS capacitor of the kind defined above.

The amplifier circuit may include a first amplifier stage. The amplifier circuit may also include a second amplifier stage having an input coupled to an output of the first amplifier stage. The MIS capacitor may be coupled in parallel with the second amplifier stage.

The first amplifier stage may comprise a differential amplifier. The differential amplifier may have a first input coupled to a reference voltage and a second input coupled to receive an output of the second amplifier stage via a feedback network.

The output node of the MIS capacitor may be coupled to the input of the second amplifier stage and to the output of the first amplifier stage.

According to another aspect of the present disclosure, there is provided an integrated circuit comprising a MIS capacitor of the kind defined above or amplifier circuit of the kind defined above.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
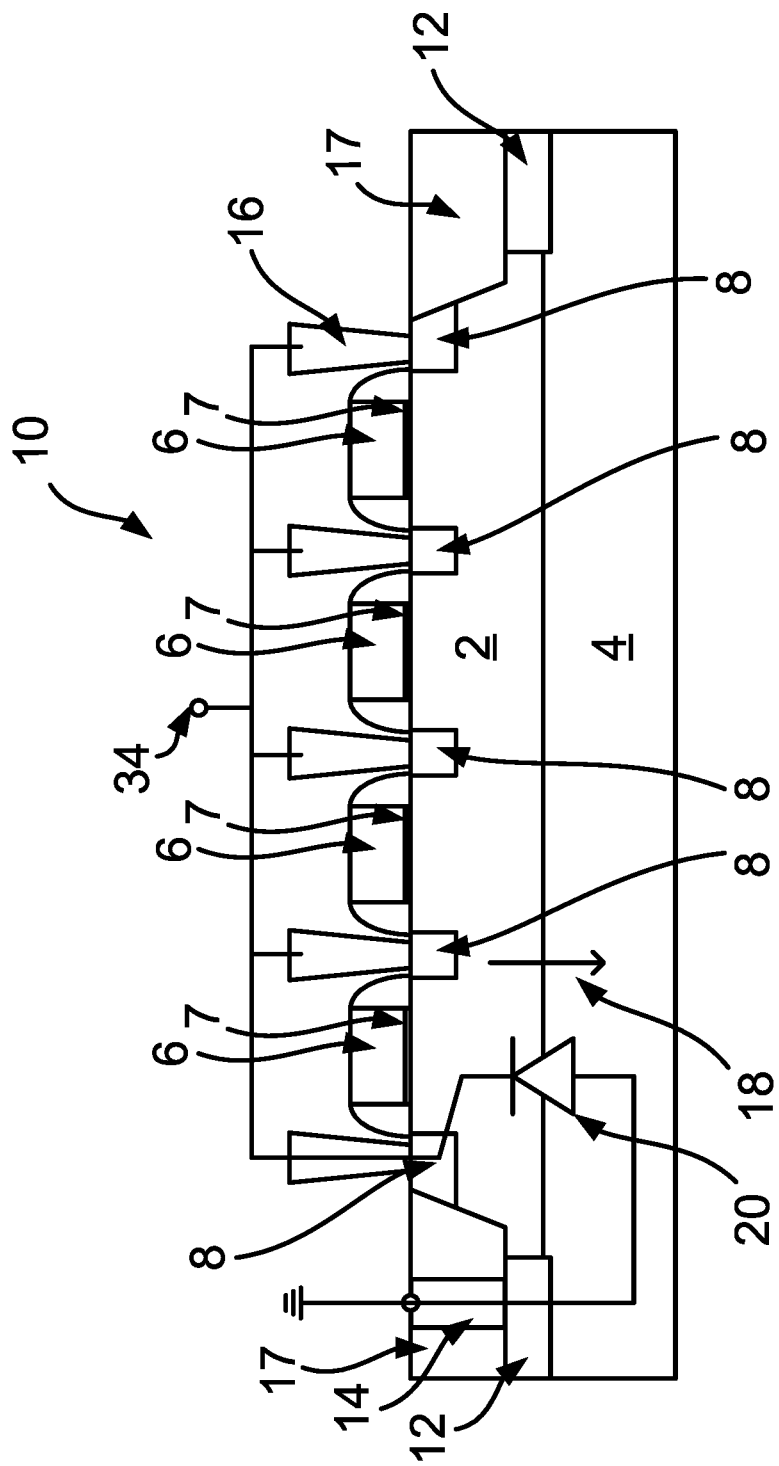
FIG. 1 shows a MIS capacitor displaying a leakage current in a PN well junction.

FIG. 1 shows a MIS capacitor 10 displaying a leakage current in a PN well junction.

The MIS capacitor 10 includes a semiconductor substrate (e.g. silicon) which has a first part 2 and a second part 4. The first part 2 in this example has n-type conductivity and the second part 4 has p-type conductivity. The first part 2 is provided at a major surface of the substrate, and the second part 4 is provided beneath the first part 2. Note that a p-n junction 20 is located at the interface between the first part 2 and the second part 4.

A plurality of gates are provided on the major surface of the substrate. Each gate includes a dielectric 7 (e.g. an oxide) located on the major surface (in contact with the first pair 2), a gate electrode 6 and optionally a pair of spacers provided on lateral sides of the gate electrode 6. The gate electrodes 6 form a first capacitor electrode ("plate") of the MIS capacitor 10 and the gate dielectric 7 forms the dielectric of the capacitor. The gate dielectric 7 may be in the form of a layer.

The MIS capacitor 10 also includes a plurality of contact regions 8 located at the major surface of the substrate, within the first part 2. The contact regions 8 in this example have n-type conductivity. The contact regions 8 in this example may be more highly doped than the first part 2. Metal contacts 16 may be used to connect each contact region 8 to an output node 34 of the MIS capacitor 10.

The MIS capacitor 10 further includes dielectric regions 17, which may extend down into the first part 2 from the major surface of the semiconductor substrate.

The MIS capacitor 10 further includes a reference voltage contact region 14. The reference voltage contact region 14 is coupled to a reference voltage (typically ground). The reference contact region 14 may have p-type conductivity. The reference contact region 14 may extend through (one or more of) the dielectric regions 17 to make contact with the well regions 12 (to be described below). In FIG. 1, only one of the dielectric regions 17 is provided with a reference contact region 14, but it will be appreciated that the other dielectric region 17 may typically also include a reference contact region 14.

The MIS capacitor 10 also includes well regions 12. The well regions 12 in this example are located (directly) beneath the reference voltage contact regions 14. The well regions 12 in this example have p-type conductivity. The well regions 12 form a bridge between the reference voltage contact regions 14 and the second part 4, across the first part 2, thereby to connect the second part 4 to the reference voltage via the well regions 12 and the reference voltage contact region 14. Note that the output node 34 is coupled to the reference voltage through the reference voltage contact region 14, the well regions 12, the second part 4, the first part 2 and the contact regions 8. The coupling between the output node 34 and the reference potential includes the p-n junction diode 20 formed at the interface between the second part 4 and the first part 2.

In operation, a parasitic reverse bias leakage current 18 ($I_{leak}$) may flow through the p-n junction diode 20, to the reference voltage (e.g. ground).

Figure 2:
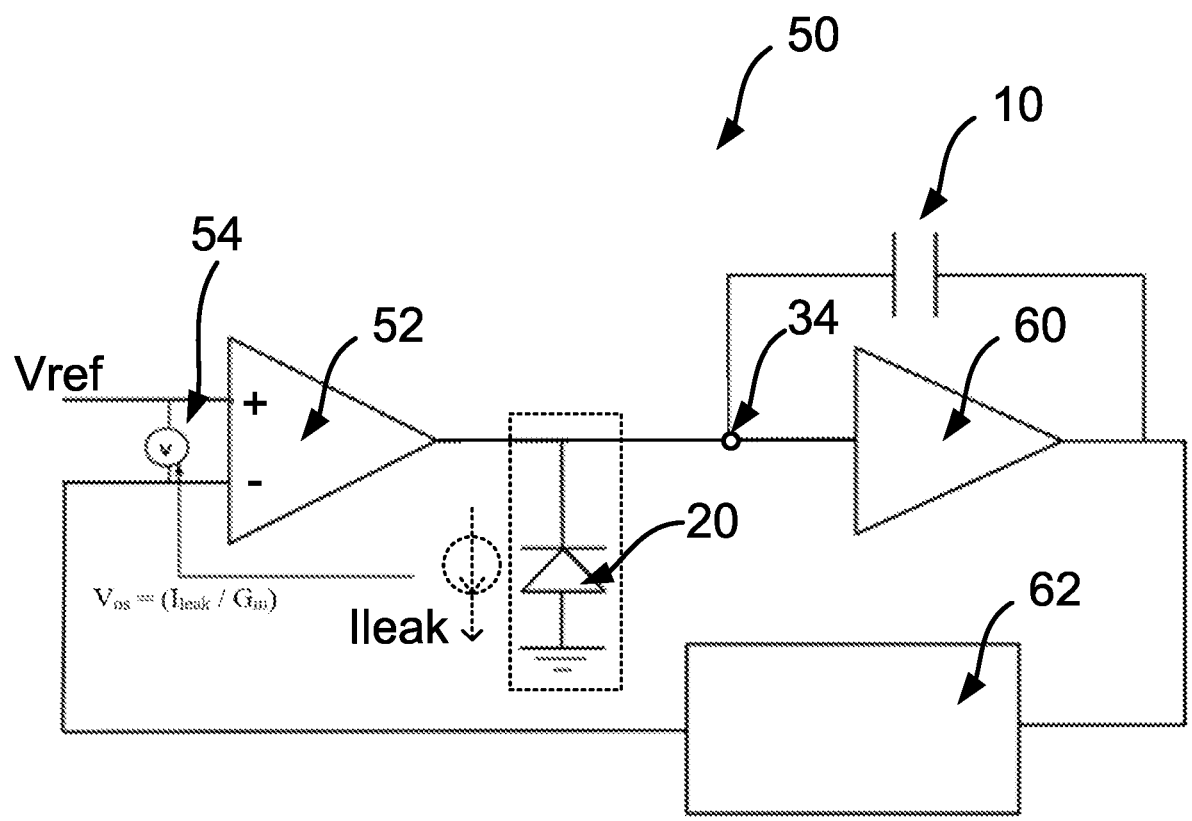
FIG. 2 shows a circuit including a MIS capacitor of the kind shown in FIG. 1.

FIG. 2 shows a circuit 50 including a MIS capacitor of the kind shown in FIG. 1. The circuit 50 implements a 2-stage high precision amplifier.

The circuit 50 includes a first stage amplifier 52. The amplifier 52 has a first input coupled to a reference potential $V_{ref}$ (e.g. ground). The amplifier 52 has a second input coupled to the output of a feedback network 62. The amplifier 52 has an output coupled to the input of a second stage amplifier 60. An output of the second stage amplifier 60 is coupled to an input of the feedback network 62.

The circuit 50 also includes a MIS capacitor 10 of the kind described above. The MIS capacitor 10 is coupled in parallel with the second stage amplifier 60. Note that the output node 34 of the MIS capacitor 10 shown in FIG. 1 corresponds to the node 34 shown in FIG. 2. The MIS capacitor 10 in FIG. 2 provides frequency compensation for the 2-stage amplifier.

As noted above in relation to FIG. 1, a parasitic reverse bias leakage current teak may flow within the MIS capacitor 10 between ground and the output node 34, owing to the p-n junction between the first part 2 and the second part 4. This leakage current is shown in FIG. 2. As can be seen in FIG. 2, in the 2-stage amplifier, this leakage current $I_{leak}$ flows from first stage amplifier 52 output node to ground. This will introduce an input offset voltage $V_{os}$. In the circuit 50 of FIG. 2, input offset voltage $V_{os}$ is given by $V_{os}=(I_{leak}/G_m)$, where the equivalent transconductance of the first stage amplifier 52 is $G_m$.

Figure 3:
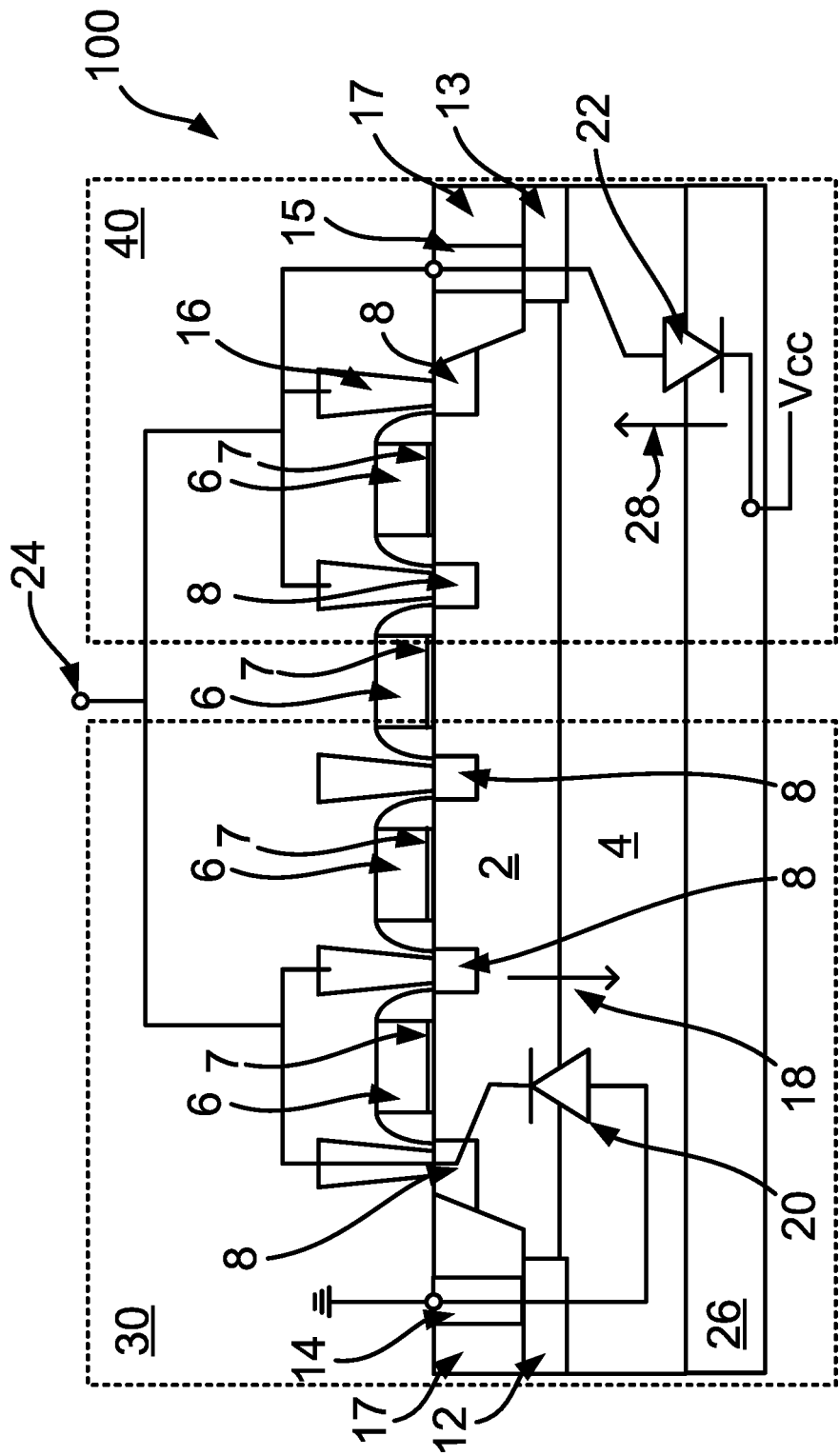
FIG. 3 shows a MIS capacitor according to an embodiment of this disclosure.

FIG. 3 shows a MIS capacitor 100 according to an embodiment of this disclosure.

The MIS capacitor 100 includes a semiconductor substrate (e.g. silicon) which has a first part 2, a second part 4 and a third part 26. The first part 2 has a first conductivity type (n-type in this embodiment). The second part 4 has a second conductivity type (p-type in this embodiment). The third part 26 has the first conductivity type (n-type in this embodiment). It is envisaged that in other embodiments, the first conductivity type may be p-type and the second conductivity type may be n-type.

The first, second and third parts 2, 4, 26 may be provided in the form of layers and/or wells provided in the semiconductor substrate. The first part 2 is provided at a major surface of the substrate. The second part 4 is provided beneath the first part 2. The third part 26 is provided beneath the second part 4. Note that the second part 4 is thus located between the first part 2 and the third part 26.

As in FIG. 1, a first p-n junction 20 is located at the interface between the first part 2 and the second part 4. In this embodiment, a second p-n junction 22 is formed at the interface between the second part 4 and the third part 26. Note that, owing to the arrangement of the first, second and third parts 2, 4, 26, the first and second p-n junctions 20, 22 have opposite orientations within the semiconductor substrate.

A plurality of gates are provided on the major surface of the substrate. Each gate may include a dielectric 7 (e.g. an oxide) located on the major surface (in contact with the first pair 2), a gate electrode 6 and (optionally also) a pair of spacers provided on lateral sides of the gate electrode 6. The gate electrodes 6 may form a first capacitor electrode ("plate") of the MIS capacitor 100 and the gate dielectric 7 may form a dielectric of the capacitor. The gate dielectric 7 may be in the form of a layer.

The MIS capacitor 100 may also include a plurality of contact regions 8 located at the major surface of the substrate, within the first part 2. The contact regions 8 have the first conductivity type (n-type in this embodiment). The contact regions 8 may be more highly doped than the first part 2. Metal contacts 16 may be used to connect each contact region 8 to an output node 24 of the MIS capacitor 100.

The MIS capacitor 100 may further include dielectric regions 17, which may extend down into the first part 2 from the major surface of the semiconductor substrate.

The MIS capacitor 100 further includes a reference voltage contact region 14. The reference voltage contact region 14 may have the second conductivity type (p-type in this embodiment). The reference voltage contact region 14 may be more highly doped than the second part 4. The reference contact region 14 may extend from the major surface of the substrate, through one of the dielectric regions 17, to make contact with the well region 12 (to be described below). The reference voltage contact region 14 is coupled to a reference voltage (e.g. ground).

The MIS capacitor 100 may also include a well region 12. The well region 12 in this embodiment may be located (e.g. directly) beneath the reference voltage contact region 14. The well region 12 has the second conductivity type (p-type in this embodiment). As in FIG. 1, well region 12 may form a bridge between the reference voltage contact region 14 and the second part 4, across the first part 2, thereby to connect the second part 4 to the reference voltage (e.g. ground) via the well region 12 and the reference voltage contact region 14. Again, note that the output node 24 is coupled to the reference voltage through the reference voltage contact region 14, the well region 12, the second part 4, the first part 2 and the contact regions 8. The coupling between the output node 24 and the reference potential includes the p-n junction diode 20 formed at the interface between the second part 4 and the first part 2. As in FIG. 1, in operation, a parasitic reverse bias leakage current 18 ($I_{leak}$) may flow through the p-n junction diode 20, to the reference voltage (e.g. ground).

In FIG. 3, the MIS capacitor 100 is schematically shown as having two sections including a first section 30 and a second section 40. The arrangement and operation of the features of first section 30 is similar to the arrangement and operation of the corresponding features of the MIS capacitor 10 described above in relation to FIG. 1. The arrangement and operation of the features of the second section 40 will now be described.

As noted above, in the present embodiment, a second p-n junction 22 is formed at the interface between the second part 4 and the third part 26. This second p-n junction 22 has the opposite orientation to the first p-n junction 20. The third part 26 (corresponding to the cathode of the p-n junction 22 in this embodiment) is coupled to a supply voltage $V_{cc}$. The second section 40 in this embodiment also includes a further contact region 15. The further contact region 15 may extend from the major surface of the substrate, through one of the dielectric regions 17, to make contact with the well region 13 (to be described below). Note that the further contact region 15 is coupled to the output node 24 along with the contact regions 8.

The second section 40 in this embodiment further includes a well region 13. The well region 13 in this embodiment is located (e.g. directly) beneath the further contact region 15. The well region 13 has the second conductivity type (p-type in this embodiment). The well region 13 may form a bridge between the further contact region 15 and the second part 4, across the first part 2, thereby to connect the second part 4 to the output node 24 via the further contact region 15.

Note that the output node 24 is thus coupled to the supply voltage $V_{cc}$ through the further contact region 15, the well region 13, the second part 4 and the third part 26. The coupling between the output node 24 and $V_{cc}$ includes the second p-n junction diode 22 formed at the interface between the second part 4 and the third part 26. As the second p-n junction diode 22 is reversed biased for currents flowing from Vcc to the output node 24 (in operation, $V_{cc}$ is typically higher than the voltage at the output node 24), a leakage current 28 ($I_{comp}$) flows through the second p-n junction diode 22 to the output node 24. Note that this leakage current $I_{comp}$ has the opposite direction in the semiconductor substrate to the leakage current 18 ($I_{leak}$). In accordance with embodiments of this disclosure, the configuration of the second p-n junction (e.g. in accordance with the doping of the second part 4 and the third part 26) and the value of the supply voltage Vcc may be chosen such that $I_{comp}$ is substantially equal and opposite to $I_{leak}$ ($I_{comp} \approx -I_{leak}$). As will be described below, $I_{leak}$ and $I_{comp}$ therefore tend to cancel each other out during operation of a circuit including the MIS capacitor 100.

Figure 4:
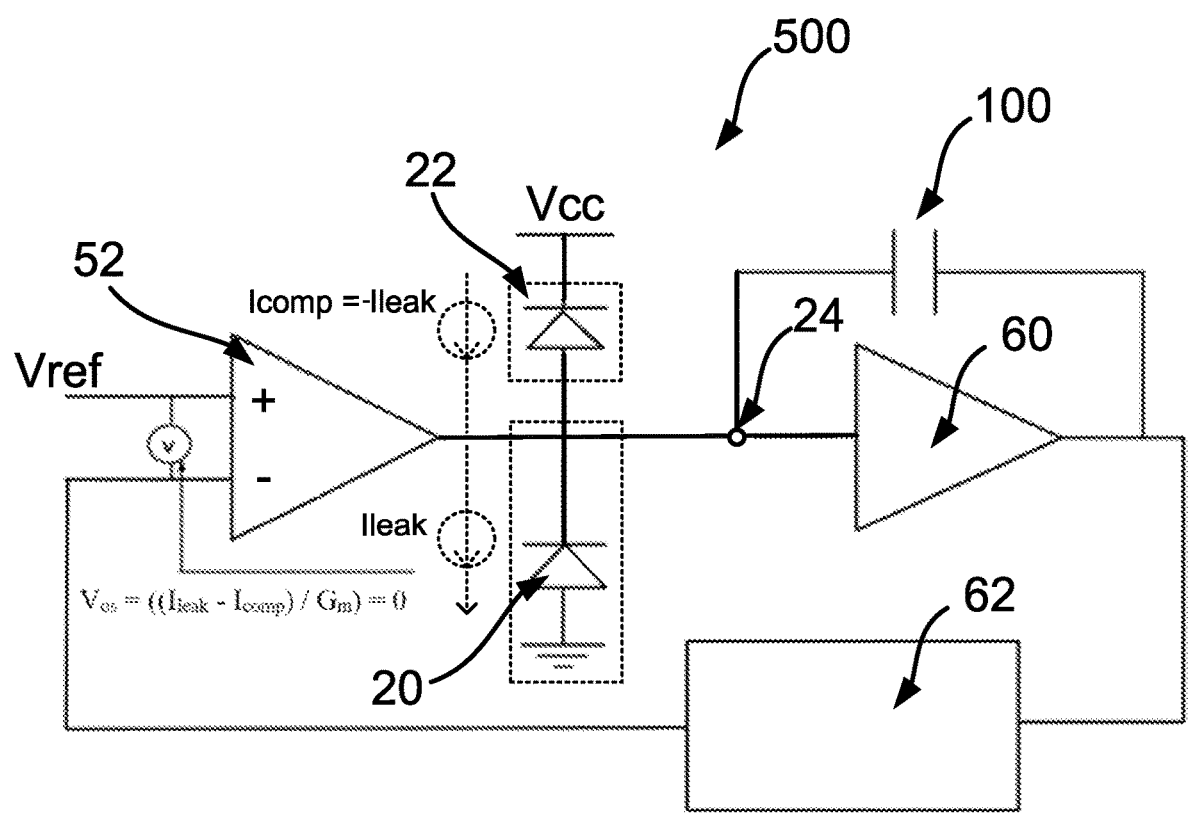
FIG. 4 shows a circuit including a MIS capacitor (e.g. the MIS capacitor of FIG. 3) according to another embodiment of this disclosure.

FIG. 4 shows a circuit 500 including a MIS capacitor 100 of the kind shown in FIG. 3. The circuit 500 in this embodiment may implement a 2-stage high precision amplifier.

The circuit 500 includes a first stage amplifier 52. The amplifier 52 has a first input coupled to a reference potential $V_{ref}$ (e.g. ground). The amplifier 52 has a second input coupled to the output of a feedback network 62. The amplifier 52 has an output coupled to the input of a second stage amplifier 60. An output of the second stage amplifier 60 is coupled to an input of the feedback network 62.

The circuit 500 also includes a MIS capacitor 100 of the kind described above in relation to FIG. 3. The MIS capacitor 100 is coupled in parallel with the second stage amplifier 60. Note that the output node 24 of the MIS capacitor 100 shown in FIG. 3 corresponds to the node 24 shown in FIG. 4. The MIS capacitor 100 in FIG. 3 may provide frequency compensation for the 2-stage amplifier.

As noted above in relation to FIG. 3, a parasitic reverse bias leakage current $I_{leak}$ may flow within the MIS capacitor 100 between ground and the output node 24, owing to the p-n junction between the first part 2 and the second part 4. This leakage current $I_{leak}$ is shown in FIG. 4. As can be seen in FIG. 4, in the 2-stage amplifier, this leakage current $I_{leak}$ flows from first stage amplifier 52 output node to ground. However, as also described above in relation to FIG. 3, a reverse bias leakage current $I_{comp}$ may also flow within the semiconductor substrate incorporating the MIS capacitor 100. $I_{comp}$ may be substantially equal and opposite to $I_{leak}$ ($I_{comp} \approx -I_{leak}$). This leakage current (or "compensation current") is also shown in FIG. 4. Note that both $I_{leak}$ and $I_{comp}$ flow through the output node 24, where they may substantially cancel each other out. Accordingly, the input offset voltage $V_{os}$ for the 2-stage amplifier implemented by the circuit of FIG. 4 may be smaller than the input offset voltage $V_{os}$ for a circuit of the kind shown in FIG. 2. In particular, in embodiments in which $I_{comp} \approx -I_{leak}$, $V_{os}$ may be substantially zero ($V_{os} = ((I_{leak} - I_{comp})/G_m) \approx 0$, where the equivalent transconductance of the first stage amplifier 52 is $G_m$). It is also envisaged that $V_{os}$ may be substantially temperature independent, to the extent that the temperature dependence of the reverse bias leakage currents of the p-n junctions 20, 22 in FIG. 3 are similar. Furthermore, because the reverse bias leakage current of a p-n junction diode is largely independent of the reverse bias voltage, the above mentioned condition $I_{comp} \approx -I_{leak}$ may remain stable and valid across a wide range of output voltages $V_{out}$ (assuming that $V_{cc} \gg V_{out}$).

The MIS capacitor may be provided in an integrated circuit (IC). The IC may include other components, such as those forming the circuit 500 of FIG. 4.

Accordingly, there has been described a MIS capacitor and a method of making the same. The capacitor includes a semiconductor substrate having a first part having a first conductivity type and contact regions for coupling the first part to an output node. The substrate has dielectric on a surface of the first part and electrodes on the dielectric. The substrate has a second part having a second conductivity type and a third part having the first conductivity type. The third part is coupleable to a supply voltage. The second part is located between the first part and the third part. The first part and the second part form a first p-n junction and the second part and the third part form a second p-n junction. A reference contact is provided for coupling the second part to a reference voltage. A further contact region is provided for coupling the second part to the output node.

Although particular embodiments of this disclosure have been described, it will be appreciated that many modifications/additions and/or substitutions may be made within the scope of the claims.

The invention claimed is:

1. A Metal Insulator Semiconductor, "MIS", capacitor comprising:
    a semiconductor substrate comprising:
        a first part having a first conductivity type;
        a plurality of contact regions located in the first part for coupling the first part to an output node;
        dielectric located on a surface of the first part;
        a plurality of electrodes separated from the first part by the dielectric;
        a second part having a second conductivity type; and
        a third part having the first conductivity type, wherein the third part is coupleable to a supply voltage, wherein the second part is located between the first part and the third part, wherein the first part and the second part form a first p-n junction and wherein the second part and the third part form a second p-n junction;
        a reference contact for coupling the second part to a reference voltage; and
        a further contact region for coupling the second part to the output node.

2. The MIS capacitor of claim 1, wherein an orientation of the first p-n junction within the substrate is opposite to an orientation of the second p-n junction within the substrate.

3. The MIS capacitor of claim 2, wherein a reverse bias leakage current of the first p-n junction at least partially cancels a reverse bias leakage current of the second p-n junction.

4. The MIS capacitor of claim 3, wherein the reverse bias leakage current of the first p-n junction is substantially equal to the reverse bias leakage current of the second p-n junction.

5. The MIS capacitor of claim 1, further comprising a first well region having the second conductivity type, wherein the first well region is located between the reference contact and the second part.

6. The MIS capacitor of claim 1, further comprising a second well region having the second conductivity type, wherein the second well region is located between the further contact region and the second part.

7. The MIS capacitor of claim 1, wherein the first part, the second part and the third part each comprise a well or layer of semiconductor material located in the semiconductor substrate.

8. The MIS capacitor of claim 1, wherein the first conductivity type is n-type conductivity and wherein the second conductivity type is p-type conductivity.

9. The MIS capacitor of claim 1, wherein the reference voltage is ground.

10. An amplifier circuit including a Metal Insulator Semiconductor, "MIS", capacitor, the MIS capacitor comprising:
    a semiconductor substrate comprising:
        a first part having a first conductivity type;
        a plurality of contact regions located in the first part for coupling the first part to an output node;
        dielectric located on a surface of the first part;
        a plurality of electrodes separated from the first part by the dielectric;
        a second part having a second conductivity type; and
        a third part having the first conductivity type, wherein the third part is coupleable to a supply voltage, wherein the second part is located between the first part and the third part, wherein the first part and the second part form a first p-n junction and wherein the second part and the third part form a second p-n junction;
        a reference contact for coupling the second part to a reference voltage; and
        a further contact region for coupling the second part to the output node.

11. The amplifier circuit of claim 10, comprising:
    a first amplifier stage; and
    a second amplifier stage having an input coupled to an output of the first amplifier stage, wherein the MIS capacitor is coupled in parallel with the second amplifier stage.

12. The amplifier circuit of claim 11, wherein the first amplifier stage comprises a differential amplifier comprising:
    a first input coupled to a reference voltage; and
    a second input coupled to receive an output of the second amplifier stage via a feedback network.

13. The amplifier circuit of claim 11, wherein the output node of the MIS capacitor is coupled to the input of the second amplifier stage and to the output of the first amplifier stage.

14. The amplifier circuit of claim 10, wherein an orientation of the first p-n junction within the substrate is opposite to an orientation of the second p-n junction within the substrate.

15. The amplifier circuit of claim 14, wherein a reverse bias leakage current of the first p-n junction at least partially cancels a reverse bias leakage current of the second p-n junction.

16. The amplifier circuit of claim 15, wherein the reverse bias leakage current of the first p-n junction is substantially equal to the reverse bias leakage current of the second p-n junction.

17. The amplifier circuit of claim 10, further comprising a first well region having the second conductivity type, wherein the first well region is located between the reference contact and the second part.

18. The amplifier circuit of claim 10, further comprising a second well region having the second conductivity type, wherein the second well region is located between the further contact region and the second part.

19. The amplifier circuit of claim 10, wherein the first part, the second part and the third part each comprise a well or layer of semiconductor material located in the semiconductor substrate.

20. A method of making a Metal Insulator Semiconductor, "MIS", capacitor, the method comprising:
   forming a semiconductor substrate comprising:
      a first part having a first conductivity type;
      a second part having a second conductivity type; and
      a third part having the first conductivity type, wherein the third part is coupleable to a supply voltage, wherein the second part is located between the first part and the third part, wherein the first part and the second part form a first p-n junction and wherein the second part and the third part form a second p-n junction;
   forming a plurality of contact regions in the first part for coupling the first part to an output node;
   forming dielectric on a surface of the first part;
   forming a plurality of electrodes on the dielectric, wherein the plurality of electrodes are separated from the first part by the dielectric;
   forming a reference contact for coupling the second part to a reference voltage; and
   forming a further contact region for coupling the second part to the output node.

\* \* \* \* \*